(12) United States Patent
Conner et al.

(10) Patent No.: US 8,392,142 B1
(45) Date of Patent: Mar. 5, 2013

(54) ALGORITHMIC REDUCTION OF VEHICULAR MAGNETIC SELF-NOISE

(75) Inventors: Christopher I. Conner, Silver Spring, MD (US); John J. Holmes, Columbia, MD (US); Donald E. Pugsley, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 901 days.

(21) Appl. No.: 12/386,180

(22) Filed: Apr. 1, 2009

(51) Int. Cl.
*G01D 18/00* (2006.01)
*G01R 33/02* (2006.01)

(52) U.S. Cl. .................... 702/104; 701/525; 324/244
(58) Field of Classification Search .................... 702/104
See application file for complete search history.

(56) References Cited

U.S. PATENT DOCUMENTS

| | | | |
|---|---|---|---|
| 5,182,514 A * | 1/1993 | Rice, Jr. ..................... 324/244 |
| 6,031,377 A | 2/2000 | Watkins |
| 6,255,825 B1 | 7/2001 | Seigel et al. |
| 6,476,610 B1 | 11/2002 | Wiegert et al. |
| 6,546,344 B1 | 4/2003 | Rodrian et al. |
| 6,844,732 B2 | 1/2005 | Carlini et al. |
| 7,079,986 B2 | 7/2006 | Sieracki |
| 7,262,601 B2 | 8/2007 | Dransfield et al. |
| 7,342,399 B1 | 3/2008 | Wiegert |
| 7,400,142 B2 | 7/2008 | Greelish |
| 7,555,398 B2 * | 6/2009 | Fowler ......................... 702/104 |
| 2008/0125920 A1 | 5/2008 | Miles et al. |

OTHER PUBLICATIONS

Williams, Peter M.; "Aeromagnetic Compensation using Neural Networks"; Jun. 4, 1993; Springer-Verlag London Limited; Neural Computing & Applications; pp. 207-208.*
Leliak, Paul; "Identification and Evaluation of Magnetic-Field Sources of Magnetic Airborne Detector Equipped Aircraft"; Feb. 17, 1961; IEEE; Transactions on Aerospace and Navigational Electronics; pp. 95-97.*
Samuel H. Bickel, "Small Signal Compensation of Magnetic Fields Resulting from Aircraft Maneuvers," *IEEE Transactions on Aerospace and Electronic Systems*, vol. AES-15, No. 4, Jul. 1979, pp. 518-525.

* cited by examiner

*Primary Examiner* — Timothy Thompson
*Assistant Examiner* — Rhadames J Alonzo Miller
(74) *Attorney, Agent, or Firm* — Howard Kaiser (57) ABSTRACT

Removal of extraneous magnetic measurement components from magnetic anomaly detection (MAD) tends to increase its accuracy. Conventional removal accounts for anomalous magnetism manifested by the MAD vehicle (typically, unmanned), but assumes that the magnetic field applied to the MAD vehicle is the earth's magnetic field, i.e., is non-anomalous and known. In contrast, the present invention accounts not only for anomalous magnetism manifested by the MAD vehicle, but also for anomalous magnetism manifested in the MAD vehicle's vicinity, such as by a manned control vehicle. The present invention's mathematical characterization of vehicular "self-noise" due to induced and permanent magnetization is more refined, especially insofar as treating the vehicle's ambient magnetic field as an unknown (empirical) quantity, rather than a known (non-empirical) quantity. A typical inventive system for vehicular magnetic self-noise-reduced magnetic anomaly detection includes magnetic and other sensors, and a computer implementing the inventive mathematical characterization in processing the signals.

15 Claims, 6 Drawing Sheets

| Maneuver Number | % Thrust | Heading (deg) | Pitch (deg) | Roll (deg) |
|---|---|---|---|---|
| 1000 | 25 | 0 | 0 | 0 |
| 1001 | 50 | 0 | 0 | 0 |
| 1002 | 25 | 0 | 10 | 0 |
| 1003 | 50 | 0 | 10 | 0 |
| 1004 | 25 | 0 | -10 | 0 |
| 1005 | 50 | 0 | -10 | 0 |
| 1006 | 25 | 0 | 0 | 10 |
| 1007 | 50 | 0 | 0 | 10 |
| 1008 | 25 | 0 | 0 | -10 |
| 1009 | 50 | 0 | 0 | -10 |
| 1010 | 25 | 90 | 0 | 0 |
| 1011 | 50 | 90 | 0 | 0 |
| 1012 | 25 | 90 | 10 | 0 |
| 1013 | 50 | 90 | 10 | 0 |
| 1014 | 25 | 90 | -10 | 0 |
| 1015 | 50 | 90 | -10 | 0 |
| 1016 | 25 | 90 | 0 | 10 |
| 1017 | 50 | 90 | 0 | 10 |
| 1018 | 25 | 90 | 0 | -10 |
| 1019 | 50 | 90 | 0 | -10 |
| 1020 | 25 | 180 | 0 | 0 |
| 1021 | 50 | 180 | 0 | 0 |
| 1022 | 25 | 180 | 10 | 0 |
| 1023 | 50 | 180 | 10 | 0 |
| 1024 | 25 | 180 | -10 | 0 |
| 1025 | 50 | 180 | -10 | 0 |
| 1026 | 25 | 180 | 0 | 10 |
| 1027 | 50 | 180 | 0 | 10 |
| 1028 | 25 | 180 | 0 | -10 |
| 1029 | 50 | 180 | 0 | -10 |
| 1030 | 25 | 270 | 0 | 0 |
| 1031 | 50 | 270 | 0 | 0 |
| 1032 | 25 | 270 | 10 | 0 |
| 1033 | 50 | 270 | 10 | 0 |
| 1034 | 25 | 270 | -10 | 0 |
| 1035 | 50 | 270 | -10 | 0 |
| 1036 | 25 | 270 | 0 | 10 |
| 1037 | 50 | 270 | 0 | 10 |
| 1038 | 25 | 270 | 0 | -10 |
| 1039 | 50 | 270 | 0 | -10 |

FIG. 5

| Prototype # | Axis | % Reduction | Date |
|---|---|---|---|
| 1 | X | 91 | Jan. 11, 2008 |
| 1 | Y | 88 | |
| 1 | Z | 84 | |
| 2 | X | 90 | Jan. 11, 2008 |
| 2 | Y | 89 | |
| 2 | Z | 84 | |
| 3 | X | 91 | Feb. 29, 2008 |
| 3 | Y | 97 | |
| 3 | Z | 94 | |

FIG. 6

ALGORITHMIC REDUCTION OF VEHICULAR MAGNETIC SELF-NOISE

BACKGROUND OF THE INVENTION

The present invention relates to magnetic anomaly detection, more particularly to methods, systems, and devices for offsetting, compensating, or counterbalancing magnetic noise associated with vehicles used to carry or deploy magnetic anomaly detectors such as magnetometers and gradiometers.

Magnetic anomaly detection ("MAD") has been practiced in geological, military, and other applications, such as involving detection of ore or mineral deposits, shipwrecks, enemy submersibles, etc. According to conventional practice of magnetic anomaly detection, the magnetic anomaly detection vehicle is an unmanned vehicle equipped with a magnetic field sensor (e.g., magnetometer) or a magnetic gradient sensor (e.g., gradiometer). The unmanned vehicle is commonly either an unmanned aerial vehicle (e.g., a "UAV") or an unmanned underwater vehicle (e.g., an "ROV" or a "UUV"), and can be either autonomous or remotely controlled/operated (such as by radio signals, or using an umbilical/tether). The magnetic field/gradient sensor is carried by the unmanned vehicle to suitable locations for detecting nearby magnetic anomalies. For instance, an unmanned underwater vehicle and its magnetic sensing instrumentation can be implemented to detect magnetic anomalies that are situated upon, or buried slightly below, the sea bottom.

The successful detection of magnetic anomalies can be significantly compromised by vehicular magnetic self-noise, i.e., magnetic noise emanating from the vehicle itself that houses and conveys the magnetic sensing instrumentation. For this reason, conventional practice of magnetic anomaly detection frequently includes a process for reducing magnetic measurement components that are attributable to vehicular magnetic self-noise. Conventional vehicular magnetic self-noise reduction seeks to largely remove, from the measurements taken by the magnetic sensing instrumentation, the magnetic manifestations originating from the sensor conveyance vehicle. A conventional process of magnetic self-noise reduction typically involves three main stages. First, the vehicular self-noise is mathematically characterized. Next, calibration data are collected to solve for compensation parameters in the mathematical characterization of the vehicular self-noise. Finally, the mathematical characterization and the compensation parameters are used to remove the self-noise from data while the sensor conveyance vehicle is conducting its mission.

The conventional approach to vehicular magnetic self-noise compensation takes into consideration the anomalous magnetic manifestations emanating from the sensor conveyance vehicle (i.e., the magnetic anomaly detection vehicle), but assumes that the magnetic manifestations surrounding the sensor conveyance vehicle are non-anomalous and thus can simply be considered to be the earth's magnetic field. This assumption is valid when the magnetic conditions in the nearby extravehicular environs are non-anomalous; in such situations, the only magnetic anomalies extrinsic to the scope of measurement inquiry that need to be accounted for are those associated with the sensor conveyance vehicle. However, the conventional approach may be inadequate for any application in which anomalous magnetic circumstances exist in the vicinity of and external to the sensor conveyance vehicle, because the conventional approach does not account for these other extrinsic magnetic anomalies. A notable example of a source of extrinsic magnetic anomalies that is unaccounted for by the conventional approach is a central control vehicle (e.g., a surface ship) in a coupled two-body system in which a sensor conveyance vehicle (e.g., a remotely operated underwater vehicle, or "ROV") is tethered to or otherwise physically connected to the central control vehicle at a close distance.

SUMMARY OF THE INVENTION

In view of the foregoing, an object of the present invention is to provide an improved methodology for offsetting the magnetic effects of a vehicular carrier of magnetic sensing instrumentation for detecting magnetic anomalies in locations approached by the vehicular carrier.

The present invention provides an improved mathematical characterization of the magnetic self-noise, due to induced magnetization (IM) and permanent magnetization (PM), of a (typically, unmanned) vehicle equipped with magnetic sensing instrumentation for performing magnetic anomaly detection (MAD). Inventive practice results in much greater accuracy in MAD endeavors in which extravehicular extraneous magnetic anomalies are present. Inventive practice is possible with respect to air, water (e.g., underwater), or land applications, or to combinations thereof. The sensor conveyance vehicle that is the subject of inventive self-noise reduction can be manned or unmanned, and can be an air vehicle, a water (e.g., underwater) vehicle, and/or a land vehicle.

An inventive system is typically embodied to perform magnetic anomaly detection so as to reduce the magnetic self-noise of the vehicle housing the system. The inventive system comprises at least one magnetic sensor, at least one vehicle attitude sensor, at least one ammeter shunt, and a computer. The computer executes computer code characterized by computer program logic for enabling the computer to process output from the at least one magnetic sensor, the at least one vehicle attitude sensor, and the at least one ammeter shunt. The computer code is executable by the computer so that, in accordance with the computer program logic, the computer performs steps including: characterizing the vehicular magnetic self-noise due to induced magnetization and permanent magnetization according to the equations $$B_X^{IM}+B_X^{PM}=u_1R_{11}+u_2R_{12}+u_3R_{13}+u_4R_{21}+u_5R_{22}+u_6R_{23}+u_7R_{31}+u_8R_{32}+u_9R_{33}+p_{xyz};$$

$$B_Y^{IM}+B_Y^{PM}=v_1R_{11}+v_2R_{12}+v_3R_{13}+v_4R_{21}+v_5R_{22}+v_6R_{23}+v_7R_{31}+v_8R_{32}+v_9R_{33}+p_{xyz};$$

$$B_Z^{IM}+B_Z^{PM}=w_1R_{11}+w_2R_{12}+w_3R_{13}+w_4R_{21}+w_5R_{22}+w_6R_{23}+w_7R_{31}+w_8R_{32}+w_9R_{33}+p_{xyz};$$

$$R = \begin{bmatrix} \cos(\beta)\cos(\gamma) & \cos(\beta)\sin(\gamma) & -\sin(\beta) \\ \sin(\alpha)\sin(\beta)\cos(\gamma) - \cos(\alpha)\sin(\gamma) & \sin(\alpha)\sin(\beta)\sin(\gamma) + \cos(\alpha)\cos(\gamma) & \sin(\alpha)\cos(\beta) \\ \cos(\alpha)\sin(\beta)\cos(\gamma) + \sin(\alpha)\sin(\gamma) & \cos(\alpha)\sin(\beta)\sin(\gamma) - \sin(\alpha)\cos(\gamma) & \cos(\alpha)\cos(\beta) \end{bmatrix};$$

$$R = \begin{bmatrix} R_{11} & R_{12} & R_{12} \\ R_{21} & R_{22} & R_{23} \\ R_{31} & R_{32} & R_{33} \end{bmatrix};$$

characterizing the vehicular magnetic self-noise due to stray magnetic fields according to the equations $$B_X^{Stray} = a_1 I_1 + a_2 I_2 + \ldots + a_N I_N;$$

$$B_Y^{Stray} = b_1 I_1 + b_2 I_2 + \ldots + b_N I_N;$$

$$B_Z^{Stray} = c_1 I_1 + c_2 I_2 + \ldots + c_N I_N;$$

calculating a, b, c, u, v, and w; and, calculating the vehicular magnetic self-noise due to induced magnetization, permanent magnetization, and stray magnetic fields. The calculating of a, b, c, u, v, and w includes using the equations and using calibration data from the at least one magnetic sensor, the at least one vehicle attitude sensor, and the at least one ammeter shunt. The calculating of the vehicular magnetic self-noise includes using the equations, using the calculated a, b, c, u, v, and w, and using magnetic anomaly detection data from the at least one magnetic sensor, the at least one vehicle attitude sensor, the at least one ammeter shunt.

In the equations stated in the preceding paragraph: $B_X^{IM}$ is the magnetic field in the x-direction due to induced magnetization of the vehicle; $B_X^{PM}$ is the magnetic field in the x-direction due to the permanent magnetization of the vehicle; $B_X^{Stray}$ is the magnetic field in the x-direction due to stray magnetic fields of the vehicle; $B_Y^{IM}$ is the magnetic field in the y-direction due to the induced magnetization of the vehicle; $B_Y^{PM}$ is the magnetic field in the y-direction due to the permanent magnetization of the vehicle; $B_Y^{Stray}$ is the magnetic field in the y-direction due to stray magnetic fields of the vehicle; $B_Z^{IM}$ is the magnetic field in the z-direction due to the induced magnetization of the vehicle; $B_Z^{PM}$ is the magnetic field in the z-direction due to the permanent magnetization of the vehicle; $B_Z^{Stray}$ is the magnetic field in the z-direction due to stray magnetic fields of the vehicle. a, b, c, u, v, and w are unknown calibration coefficients; $R_{ij}$ is the ith by jth element of the matrix R; $\alpha$ is the pitch of the vehicle housing the system; $\beta$ is the roll of the vehicle housing the system; $\gamma$ is the heading of the vehicle housing the system; $I_1$ through $I_N$ are the current powering each of N circuits.

As the inventive system is frequently embodied, the magnetic anomaly detection data from the at least one magnetic sensor is the raw magnetic anomaly detection data from the at least one magnetic sensor. The computer performs the step of adjusting the raw magnetic anomaly detection data from the at least one magnetic sensor. The adjusting includes subtracting, from the raw magnetic anomaly detection data from the at least one magnetic sensor, the calculated vehicular magnetic self-noise due to induced magnetization, permanent magnetization, and stray magnetic fields. According to many embodiments, the inventive system further comprises a data link device for transmitting, to a remote location, the adjusted magnetic anomaly detection data from the at least one magnetic sensor.

When equipped with a magnetic field sensor or a magnetic gradient sensor, an underwater vehicle (such as an "ROV" or a "UUV") can be used for detecting magnetic anomalies on, or buried slightly below, the sea bottom. Objects of interest, such as pipes or chains, create distortions in the earth's magnetic field that allow for detection. However, the success in detecting the magnetic distortions of these anomalies is reduced by the magnetic noise emanating from the vehicle itself, i.e., the magnetic self-noise of the vehicle. As typically embodied, the present invention more accurately reduces the magnetic noise of underwater vehicles that are used to detect magnetic anomalies. The present invention's reduction of a vehicle's noise significantly increases the probability of success in correctly detecting magnetic anomalies of interest.

Generally speaking, magnetic anomaly detection seeks to measure magnetic manifestations to detect anomalies in selected areas of focus. In so doing, it is desirable to eliminate from measurement data any detected magnetic anomalies that are associated with magnetic manifestations that are extrinsic to the selected areas of focus. Conventional self-noise reduction methodology accounts for extrinsic magnetic anomalies that are manifested by the sensor conveyance vehicle, but fails to take other extrinsic magnetic anomalies into account, such as those manifested by a separate, proximate vehicle. In contrast, the present invention accounts not only for extrinsic magnetic anomalies of the sensor conveyance vehicle, but also for extrinsic magnetic anomalies in the vicinity of the sensor conveyance vehicle. The present invention as typically embodied removes, from a sensor conveyance (MAD) vehicle's onboard measurement, the vehicle's magnetic self-noise according to the present inventions uniquely perfected definition of the vehicle's magnetic self-noise. The terms "magnetic anomaly detection vehicle" and "detection vehicle" and "sensor conveyance vehicle" are used interchangeably herein. The inventively removed magnetic self-noise can be in the form of magnetic field self-noise, or magnetic gradient self-noise, or some combination thereof.

Featured by the present invention is a novel self-noise compensatory algorithm that, in relation to induced and permanent magnetization, is more complete and exact than the conventional self-noise compensatory algorithm. The present invention's self-noise compensatory algorithm is comparable to the conventional self-noise compensatory algorithm insofar as treating the magnetic field(s) emanated by the vehicle as an unknown quantity.

However, the present invention's self-noise compensatory algorithm is unique in that it also treats the vehicle's ambient magnetic field—i.e., the magnetic field(s) applied to the vehicle, as distinguished from the magnetic field(s) emanated by the vehicle—as an unknown quantity. This is in contradistinction to the conventional self-noise compensatory algorithm's treatment of the vehicle's ambient magnetic field as a known quantity, namely, the earth's magnetic field, without qualification. The present invention's self-noise compensatory algorithm, as pertains to IM and PM, takes into account the magnetic manifestations not only of the sensor conveyance vehicle, but also of any other nearby entity, such as a second vehicle that represents the control center for the sensor conveyance vehicle.

Accordingly, inventive practice is especially propitious in applications in which the sensor conveyance vehicle, in normal operation, is close to a different vehicle that serves some operational purpose. For instance, the present invention is beneficially embodied in association with a remotely operated vehicle (e.g., an underwater ROV) and a central control vehicle (e.g., a surface ship) to which the remotely operated vehicle is tethered (e.g., via umbilical cable). In such applications, the present invention treats the central control vehicle as, in essence, an extension of the sensor conveyance vehicle. In inventive principle, the vehicular magnetic manifestations, in aggregate, are those of the sensor conveyance vehicle in combination with those of the central control vehicle. More generally, in a multi-vehicle system of this nature, the present invention mathematically defines the overall vehicular self-noise due to IM and PM as encompassing each of the individual vehicular self-noise components. The present invention's noise reduction process can thus prove advantageous over the conventional noise reduction process. If the sensor conveyance vehicle performs calibration maneuvers in a forward area that contains large magnetic anomalies, then the inventive noise reduction process will be more effective in accurately reducing the magnetic self-noise of the sensor conveyance vehicle.

In addition to affording improved self-noise reduction with respect to IM and PM, the present invention also affords improved self-noise reduction with respect to finding certain mathematical solutions in self-noise reduction contexts in general. This aspect of the present invention can prove to be more effective if the primary goal of a self-noise reduction is to reduce the "peak" self-noise, as distinguished from a primary goal of reducing an average or overall self-noise based on root-mean-square (RMS) analysis (e.g., involving standard deviation from an arithmetic mean). The present invention thus features a novel mathematical technique for solving for unknowns in equations. This inventive mathematical technique can be practiced in an inventive vehicular magnetic self-noise reduction process, or in a non-inventive vehicular magnetic self-noise reduction process.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein like numbers indicate same or similar parts or components, and wherein.

DESCRIPTION OF EXEMPLARY EMBODIMENTS OF THE INVENTION

Mathematical characterization of vehicular magnetic self-noise begins with a decomposition of the vehicular magnetic self-noise in accordance with magnetic source. A vehicle has three main sources of magnetization that contribute to its self-noise. These three magnetic sources are (i) induced magnetization ("IM"), (ii) permanent magnetization ("PM"), and (iii) stray fields ("Stray"). The term "induced magnetization" as used herein generally refers to the distortion of the earth's ambient magnetic field through the ferromagnetic material of onboard objects. The term "permanent magnetization" as used herein generally refers to the magnetic fields produced by ferromagnetic materials of onboard objects. The term "stray fields" as used herein generally refers to magnetic fields created by electrical currents in onboard circuitry.

Figure 1:
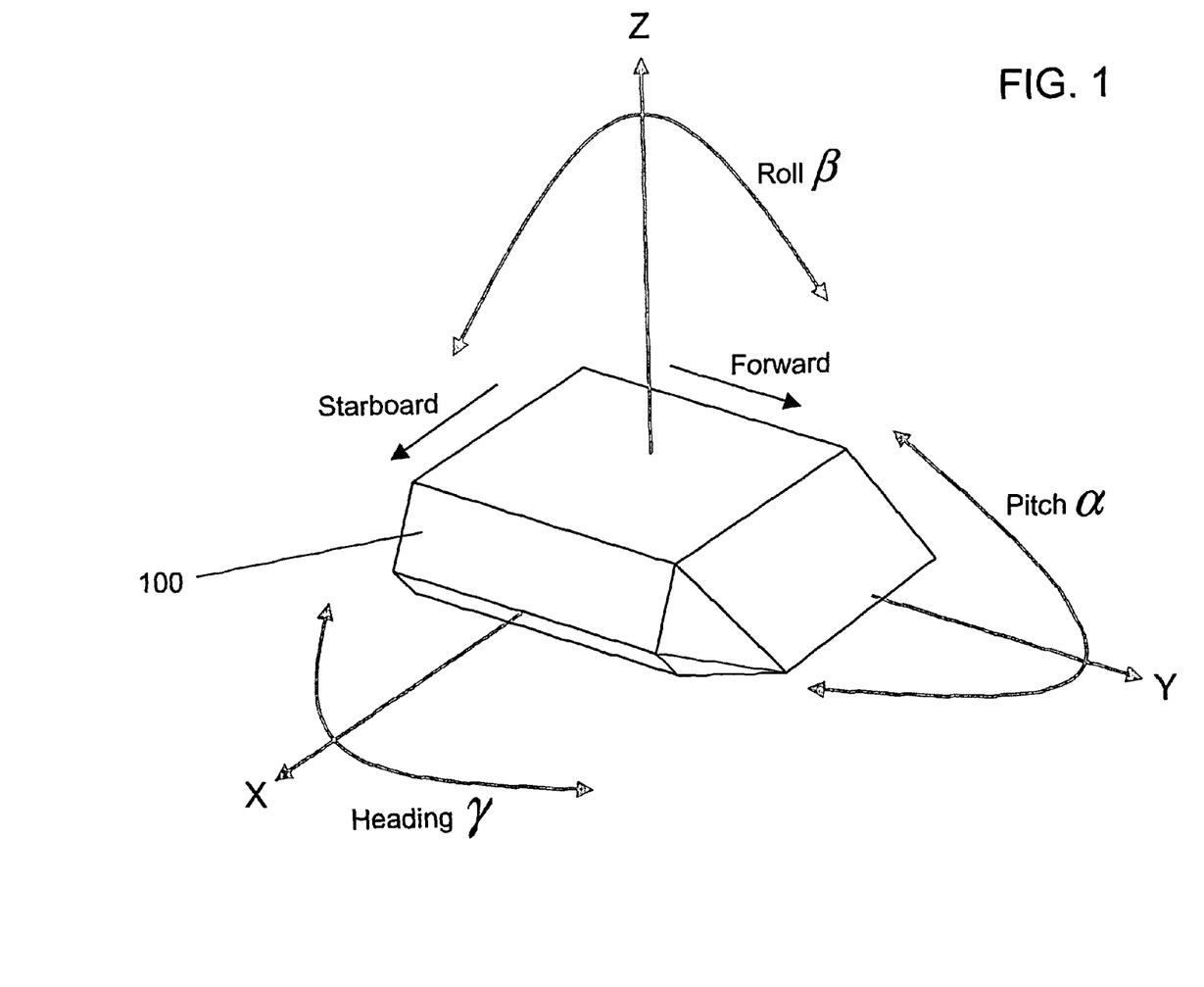
FIG. 1 is a diagrammatic rendering, in perspective view, of a sensor conveyance vehicle, particularly illustrating navigational directions and rotational movements of the vehicle.

With reference to FIG. 1, a Cartesian coordinate system is assumed for the three-dimensional space of interest, which contains the magnetic anomaly detection vehicle 100. The x-direction is assumed to be positive from port to starboard moving athwartship along the vehicle. The y-direction is assumed to be positive longitudinally moving forward along the vehicle. The z-direction is assumed to be positive moving upward vertically along the vehicle. Although vehicle 100 is portrayed in FIG. 1 as a generally representative underwater vehicle, it is to be understood that, according to inventive practice, vehicle 100 can be any vehicle—land, sea, or air—that is useable for magnetic anomaly detection.

Conventional Characterization of Vehicular Magnetic Self-Noise from all Three Sources A vehicle's "magnetic self-noise" is the magnetic gradient or magnetic field emanating from the vehicle. Basically speaking, the magnetic self-noise of a vehicle may be characterized by Equation (1), Equation (2), and Equation (3), which demonstrate that the magnetic self-noise of a vehicle can be obtained by summing the self-noise from the three magnetic sources, viz., induced magnetization, permanent magnetization, and stray magnetic fields.

$$B_X^{Vehicle} = B_X^{IM} + B_X^{PM} + B_X^{Stray} \quad (1)$$

$$B_Y^{Vehicle} = B_Y^{IM} + B_Y^{PM} + B_Y^{Stray} \quad (2)$$

$$B_Z^{Vehicle} = B_Z^{IM} + B_Z^{PM} + B_Z^{Stray} \quad (3)$$

In Equations (1) through (3), $B_X^{Vehicle}$ represents the total magnetic self-noise of a vehicle in the x-direction. $B_X^{IM}$ represents the magnetic self-noise in the x-direction generated by a vehicle's induced magnetization. $B_Y^{PM}$ represents the magnetic self-noise in the y-direction produced by a vehicle's permanent magnetization. $B_Z^{Stray}$ represents the magnetic self-noise in the z-direction generated by a vehicle's stray magnetic fields.

Conventional Characterization of Vehicular Magnetic Self-Noise Due to IM and PM

The magnetic self-noise due to a vehicle's induced magnetization and permanent magnetization can also be characterized as a set of linear equations. The magnetic self-noise due to IM and PM is conventionally characterized by Equation (4), Equation (5), and Equation (6).

$$B_X^{IM} + B_X^{PM} = a_1 E_Y + a_2 E_X + a_3 E_Z + p_{xyz} \quad (4)$$

$$B_Y^{IM} + B_Y^{PM} = b_1 E_X + b_2 E_Y + b_3 E_Z + p_{xyz} \quad (5)$$

$$B_Z^{IM} + B_Z^{PM} = c_1 E_X + c_2 E_Y + c_3 E_Z + p_{xyz} \quad (6)$$

In Equations (4) through (6), the vector E represents the magnetic field applied to the vehicle (typically the earth's ambient magnetic field) in the vehicle's coordinate system. This means that E is dependant on both the earth's ambient magnetic field and the vehicle's orientation in that ambient field. The coefficients a, b, c, and $p_{XYZ}$ are unknown coefficients that are determined by using calibration measurements. $B_X^{IM}$ and $B_X^{PM}$ are the magnetic field in the x-direction due to the vehicle's induced magnetization and permanent magnetization, respectively. $B_Y^{IM}$ and $B_Y^{PM}$ are the magnetic field in the y-direction due to the vehicle's induced magnetization and permanent magnetization, respectively. $B_Z^{IM}$ and $B_Z^{PM}$ are the magnetic field in the z-direction due to the vehicle's induced magnetization and permanent magnetization, respectively.

Conventional Characterization of Vehicular Magnetic Self-Noise Due to Stray Fields The self-noise due to a vehicle's stray magnetic fields can also be characterized as a set of linear equations. The magnetic self-noise due to stray fields is conventionally characterized by Equation (7), Equation (8), and Equation (9).

$$B_X^{Stray} = a_1 I_1 + a_2 I_2 + \ldots + a_N I_N \quad (7)$$

$$B_Y^{Stray} = b_1 I_1 + b_2 I_2 + \ldots + b_N I_N \quad (8)$$

$$B_Z^{Stray} = c_1 I_1 + c_2 I_2 + \ldots + c_N I_N \quad (9)$$

In Equations (7) through (9), $I_1$ through $I_N$ represent the current powering each of the N major circuits (for example, current that powers thrusters). The coefficients a, b, and c are unknowns that are computed using special calibration measurements. $B_X^{Stray}$ is the magnetic self-noise in the x-direction due to stray fields. $B_Y^{Stray}$ is the magnetic self-noise in the y-direction due to stray fields. $B_Z^{Stray}$ is the magnetic self-noise in the z-direction due to stray fields.

Conventional Calculation of Vehicular Magnetic Self-Noise from all Three Sources Generally speaking, a moving vehicle—whether it be land-going, air-going, or sea-going—is characterized by rotational motion with respect to three perpendicular axes in three-dimensional space. The three kinds of rotational vehicle motion, illustrated in FIG. 1, are commonly referred to as. "roll" (rotational movement about a horizontal fore-and-aft axis), "pitch" (rotational movement about a horizontal port-and-starboard axis), and "heading" (rotational movement about a vertical axis). The terms "heading" and "yaw" are commonly used synonymously in this sense.

By performing a series of calibration maneuvers where the sensor conveyance vehicle's orientation in the earth's ambient field and its electrical loads are varied, the magnetic self-noise for each magnetic source can be calculated. The current that is sent to the circuits, the magnetic gradient, the magnetic field, and the vehicle's orientation are recorded while the vehicle is being calibrated. According to the conventional process of removing a vehicle's magnetic self-noise, the coefficients are compensated using a linear least squares fit.

First, the self-noise due to stray fields is calculated from two series of measurements where the current powering each of the N major onboard circuits is varied, but the vehicle's orientations are the same. The currents in the onboard circuits are fit to the self-noise from stray fields to solve for the unknown compensation coefficients a, b, and c in Equations (7) through (9). A linear least squares fit is conventionally used on board to solve for these coefficients. The linear least squares fit analysis minimizes the root mean square ("RMS") error between the predicted self-noise and measured self-noise.

Next, a series of calibration measurements are taken where the pitch, roll, and heading are varied in turn; but the power supplied to the vehicle's major circuits is held constant. From these maneuvers, the magnetic self-noise due to IM and PM can be calculated. The magnetic field in the x, y, and z-direction (vehicle's coordinate system) are fit to the self-noise from IM and PM to solve for the unknown coefficients a, b, c, and $p_{xyz}$ in Equations (4) through (6). A linear least squares fit that minimizes RMS error between the predicted self-noise and the measured self-noise is also conventionally used to solve for these coefficients.

While the sensor conveyance vehicle is operating, the calibration coefficients are used with the measured current sent to the onboard circuits and the vehicle's orientation information to calculate the magnetic self-noise due to PM, IM, and stray fields using Equation (4), Equation (5), Equation (6), Equation (7), Equation (8), and Equation (9). The self-noise from the three magnetic sources are then summed and subtracted from the onboard magnetic field sensor or gradient sensor.

Inventive Characterization of Vehicular Magnetic Self-Noise Due to IM and PM

The present invention's vehicular magnetic self-noise reduction methodology shares some features with conventional vehicular magnetic self-noise reduction methodology. According to either the conventional approach or the inventive approach, magnetic self-noise of a vehicle from all three magnetic self-noise sources is characterized by summing the respective self-noise components from the three magnetic self-noise sources in accordance with Equations (1) through (3). Furthermore, according to either the conventional approach or the inventive approach, the magnetic self-noise from stray fields is characterized by Equations (7) through (9).

Notwithstanding the above-noted similarities to conventional self-noise reduction, the present invention is new in several important respects. A first novel aspect of the present invention is its manner in which the magnetic self-noise from a vehicle's PM and IM are characterized. A second novel aspect of the present invention is its manner in which the unknowns are found in equations that characterize the self-noise.

The present invention uniquely characterizes the magnetic self-noise from a vehicle's PM and IM. This aspect of the present invention is founded on the present inventors' recognition that success in reducing a vehicle's magnetic self-noise produced by the vehicle's IM and PM is heavily dependent on the accuracy of the vehicle's ability to measure or predict the earth's ambient magnetic field while performing calibration maneuvers. Conventional characterization of the magnetic self-noise from a vehicle's PM and IM is unsatisfactory when the sensor conveyance vehicle is being calibrated in an area containing at least one source of large magnetic background noise; under such circumstances, the conventional vehicular magnetic self-noise reduction process will not result in significant self-noise reduction.

The present invention's equations characterizing the self-noise from IM and PM differ considerably from the conventional equations characterizing the self-noise from IM and PM. In accordance with the present invention, Equation (10), Equation (11), and Equation (12) are the equations for characterizing the vehicular magnetic self-noise due to IM and PM.

$$B_X^{IM}+B_X^{PM}=u_1R_{11}+u_2R_{12}+u_3R_{13}+u_4R_{21}+u_5R_{22}+u_6R_{23}+u_7R_{31}+u_8R_{32}+u_9R_{33}+p_{xyz} \qquad (10)$$

$$B_Y^{IM}+B_Y^{PM}=v_1R_{11}+v_2R_{12}+v_3R_{13}+v_4R_{21}+v_5R_{22}+v_6R_{23}+v_7R_{31}+v_8R_{32}+v_9R_{33}+p_{xyz} \qquad (11)$$

$$B_Z^{IM}+B_Z^{PM}=w_1R_{11}+w_2R_{12}+w_3R_{13}+w_4R_{21}+w_5R_{22}+w_6R_{23}+w_7R_{31}+w_8R_{32}+w_9R_{33}+p_{xyz} \qquad (12)$$

In Equations (10) through (12), the coefficients u, v, and w are unknown calibration coefficients, to be determined empirically. The $R_{ij}$ term is the ith by jth element of the matrix R in Equation (13). Equation (13)'s definitional version of matrix R is equally represented by Equation (14)'s denotational version of matrix R. $B_X^{IM}$ and $B_X^{PM}$ are the magnetic field in the x-direction due to the vehicle's induced magnetization and permanent magnetization, respectively. $B_Y^{IM}$ and $B_Y^{PM}$ are the magnetic field in the y-direction due to the vehicle's induced magnetization and permanent magnetization, respectively. $B_Z^{IM}$ and $B_Z^{PM}$ are the magnetic field in the z-direction due to the vehicle's induced magnetization and permanent magnetization, respectively.

Still referring to FIG. 1, let us assume that $\alpha$ is the vehicle's pitch angle, $\beta$ is the vehicle's roll, and $\gamma$ is the vehicle's heading. Matrix R, equivalently stated in Equations (13) and (14), is used to rotate the magnetic field applied to the vehicle from the earth's coordinate system into the vehicle's coordinate system—more specifically, to rotate the field values, measured by the vehicle's onboard magnetometer based on earth magnetic coordinates, into the vehicle's coordinate system.

$$R = \begin{bmatrix} \cos(\beta)\cos(\gamma) & \cos(\beta)\sin(\gamma) & -\sin(\beta) \\ \sin(\alpha)\sin(\beta)\cos(\gamma) - \cos(\alpha)\sin(\gamma) & \sin(\alpha)\sin(\beta)\sin(\gamma) + \cos(\alpha)\cos(\gamma) & \sin(\alpha)\cos(\beta) \\ \cos(\alpha)\sin(\beta)\cos(\gamma) + \sin(\alpha)\sin(\gamma) & \cos(\alpha)\sin(\beta)\sin(\gamma) - \sin(\alpha)\cos(\gamma) & \cos(\alpha)\cos(\beta) \end{bmatrix} \quad (13)$$

$$R = \begin{bmatrix} R_{11} & R_{12} & R_{12} \\ R_{21} & R_{22} & R_{23} \\ R_{31} & R_{32} & R_{33} \end{bmatrix} \quad (14)$$

The conventional methodology's Equations (4) through (6) are prone to inaccuracy in that $E_X$, $E_Y$, and $E_Z$ therein—which represent the magnetic field applied to the sensor conveyance (MAD) vehicle in the x, y, and z directions of the vehicle's coordinate system—are treated thereby as known vectors. The magnetic field is estimated by a magnetic model, rotated into the vehicle's coordinates, and plugged into Equations (4) through (6). A problem arises, however, when a large magnetic anomaly is present in the vicinity of the sensor conveyance vehicle. The conventional model becomes inaccurate in the presence of a large anomalous magnetic field, which causes $E_X$, $E_Y$, and $E_Z$ to become unknowns. In other words, the conventional assumption that E is a known, constant value of the magnetic field applied to the vehicle becomes invalid when at least one large anomalous magnetic field is in the vicinity of the vehicle. A prime example of this phenomenon is when a submersible MAD vehicle is tethered to a surface ship above, which affects (e.g., distorts) the ambient magnetic field of the submersible MAD vehicle. Due to such anomalous circumstance, the conventional quantity E cannot be known accurately.

The present invention eliminates this problem by using the inventive Equations (10) through (12), instead of the conventional Equations (4) through (6). According to the present invention's Equations (10) through (12), the $R_{ij}$ terms are the elements of the present invention's matrix R, set forth in Equations (13) and (14). The present invention's Equations (10) through (12) are unique and advantageous in that the external magnetic fields that are applied to the vehicle are included in the unknown coefficients. Therefore, if at least one large magnetic anomaly in the earth's magnetic field is present in the operating area, then this state of affairs will not diminish the success of the vehicular magnetic self-noise reduction.

The present invention thus significantly improves the self-noise removal process in cases where the sensor conveyance (MAD) vehicle is operating in the presence of one or more large anomalous magnetic fields.

The present invention's Equations (10) through (12) are derived by extracting the unknown portions of the vectors $E_X$, $E_Y$, and $E_Z$, and combining these unknown portions with the unknowns from conventional Equations (4) through (6), viz., a, b, and c. So doing produces the unknowns of the present invention's Equations (10) through (12), viz., u, v, and w. The derivation of the present invention's Equations (10) through (12) is further explained in the following paragraph.

Since R in Equations (13) and (14) can be used to rotate the field applied to the vehicle into the vehicle's frame of reference and if the vector f is defined as the field applied to the vehicle in earth's coordinate system, then Equation (15) is the multiplication that describes the rotation. Note that vector E in Equation (15) is the same vector E in Equations (4) through (6).

$$\vec{E} = R\vec{f} \quad (15)$$

Equations (16) through (18) are the result of the rotation or multiplication described in Equation (15).

$$E_X = f_X R_{11} + f_Y R_{12} + f_Z R_{13} \quad (16)$$

$$E_Y = f_X R_{21} + f_Y R_{22} + f_Z R_{33} \quad (16)$$

$$E_Z = f_X R_{31} + f_Y R_{32} + f_Z R_{33} \quad (16)$$

Equations (19) through (21) are the result of inserting Equations (16) through (18) into Equations (4) through (6).

$$\nabla B_X = a_1(f_X R_{11} + f_Y R_{12} + f_Z R_{13}) + a_2(f_X R_{21} + f_Y R_{22} + f_Z R_{23}) + a_3(f_X R_{31} + f_Y R_{32} + f_Z R_{33}) + p_{xyz} \quad (19)$$

$$\nabla B_Y = b_1(f_X R_{11} + f_Y R_{12} + f_Z R_{13}) + b_2(f_X R_{21} + f_Y R_{22} + f_Z R_{23}) + b_3(f_X R_{31} + f_Y R_{32} + f_Z R_{33}) + p_{xyz} \quad (20)$$

$$\nabla B_Z = c_1(f_X R_{11} + f_Y R_{12} + f_Z R_{13}) + c_2(f_X R_{21} + f_Y R_{22} + f_Z R_{23}) + c_3(f_X R_{31} + f_Y R_{32} + f_Z R_{33}) + p_{xyz} \quad (21)$$

Multiplying out Equations (19) through (21) gives Equations (22) through (24).

$$\nabla B_X = a_1 R_{11} f_X + a_1 R_{12} f_Z + a_1 R_{13} f_Z + a_2 R_{21} f_X + a_2 R_{22} f_Y + a_2 R_{23} f_Z + a_3 R_{31} f_X + a_3 R_{32} f_Y + a_3 R_{33} f_Z + p_{xyz} \quad (22)$$

$$\nabla B_Y = b_1 R_{11} f_X + b_1 R_{12} f_Z + b_1 R_{13} f_Z + b_2 R_{21} f_X + b_2 R_{22} f_Y + b_2 R_{23} f_Z + b_3 R_{31} f_X + b_3 R_{32} f_Y + b_3 R_{33} f_Z + p_{xyz} \quad (23)$$

$$\nabla B_Z = c_1 R_{11} f_X + c_1 R_{12} f_Z + c_1 R_{13} f_Z + c_2 R_{21} f_X + c_2 R_{22} f_Y + c_2 R_{23} f_Z + c_3 R_{31} f_X + c_3 R_{32} f_Y + c_3 R_{33} f_Z + p_{xyz} \quad (24)$$

Equations (10) through (12) are the result of combining a, b, and c with fx, fy, and fz in Equations (22) through (24), thereby giving coefficients u, v, and w.

Inventive Calculation of Vehicular Magnetic Self-Noise from all Three Sources

A second mode of inventive practice concerns the way in which unknown calibration coefficients are determined. This inventive method can be applied either to the conventional set of Equations (4) through (6), or to the inventive set of Equations (10) through (12). As previously discussed herein, conventionally these types of coefficients are computed using a linear least squares fit that reduces the RMS error of the fit.

Of particular interest herein is inventive practice combining inventive Equations (10) through (12) with inventive Equations (25) through (27). In the context of typical inventive practice involving inventive Equations (10) through (12), the inventive mathematical process of computing these types of coefficients uses a nonlinear optimization to reduce Equation (25), Equation (26), and Equation (27), which represent the peak error between the measured self-noise and the calculated self-noise.

$$\chi(u) = \max((B_x - Au)^2) \quad (25)$$

$$\chi(v) = \max((B_Y - Av)^2) \quad (26)$$

$$\chi(w) = \max((B_Z - Aw)^2) \quad (27)$$

In Equations (25) through (27), the coefficients u, v, and w are the unknown calibration coefficients that are calculated by the present invention's nonlinear optimization. $B_X$ is the magnetic self-noise in the x-direction. A is a matrix of known currents (in the case of stray fields) or orientation parameters (in the case of IM and PM) from calibration maneuvers that, when multiplied by the calibration coefficients, reproduces the magnetic self-noise. Therefore, the statement max(($B_X$ –

Au)$^2$) is the peak of the square of the error between the measured and calculated self-noise in the x-direction; the statement max(($B_Y$-Av)$^2$) is the peak of the square of the error between the measured and calculated self-noise in the y-direction; the statement max(($B_Z$-Aw)$^2$) is the peak of the square of the error between the measured and calculated self-noise in the z-direction.

The present invention's nonlinear optimization requires an initial "guess" at the unknown coefficients. Therefore, a linear least squares fit is used to calculate initial estimates of the coefficients, which are then passed to the nonlinear optimization. The calibration data that are used to solve for calibration coefficients according to the conventional process are of the same kind as the calibration data that are used to solve for calibration coefficients in the inventive process.

The self-noise due to stray fields is calculated from the same two series of measurements as described hereinabove regarding the conventional process, wherein the currents to the loads (e.g., the thrusters) are varied but the vehicle's orientation is held constant. The currents to the loads (e.g., the thrusters) are still fit to the self-noise from stray fields to solve for the unknown coefficients a, b, and c in Equations (7) through (9). A linear least squares fit that minimizes RMS error of the fit is typically used in inventive practice to solve for these coefficients in Equations (7) through (9). However, a nonlinear optimization that minimizes Equations (25) through (27) (the peak noise) is used to solve for the unknown parameters.

In order to solve for the self-noise from IM and PM, the inventive process involves the same types of series of calibration measurements as does the conventional process. However, according to the inventive process, Equations (10) through (12) are used to characterize the self-noise produced by IM and PM. Furthermore, according to the inventive process as frequently embodied, a nonlinear optimization that minimizes Equations (25) through (27) is used to solve for the unknown parameters.

While the sensor conveyance vehicle is operating, the inventive process uses the coefficients, along with the current powering the vehicle's onboard circuits and the vehicle's orientation information, to calculate the vehicular magnetic self-noise due to IM, PM, and stray fields. Equations (4) through (6) are used to calculate the magnetic self-noise due to stray fields. Inventive Equations (10) through (12) are used to calculate the magnetic self-noise due to IM and PM. The individual values of self-noise due to IM, PM, and stray fields are then summed and subtracted from the magnetic field sensor (e.g., magnetometer) or gradient sensor (e.g., gradiometer), in a manner akin to the summation and subtraction performed according in conventional process.

Inventive Characterization of Vehicular Magnetic Self-Noise in the Absence of Pitch and Roll It may be unnecessary during operation of a sensor conveyance vehicle for the vehicle to either roll or pitch. In other words, the operator may cause the vehicle to move forward (i.e., to head or yaw), without pitching and without rolling. In such situations, the present invention's matrix R of Equation (13) reduces to the present invention's matrix R' of Equation (31), which is Equation (13) where the vehicle's pitch α equals zero and the vehicle's roll β equals zero. Here, only three calibration measurements are necessary to solve for the unknown coefficients in the present invention's equations for characterizing the self-noise due to IM and PM. The present invention's Equations (10) through (12) thus reduce to the present invention's Equations (28) through (30). The roll and pitch in these maneuvers should be zero, and only the heading should be changed by the operator.

$$B_X^{IM}+B_X^{PM}=u_1R_{11}+u_2R_{12Y}+p_{xyz} \quad (28)$$

$$B_Y^{IM}+B_Y^{PM}=v_1R_{11}+v_2R_{12Y}+p_{xyz} \quad (29)$$

$$B_Z^{IM}+B_Z^{PM}=w_1R_{11}+w_2R_{12Y}+p_{xyz} \quad (30)$$

$$R' = \begin{bmatrix} \cos(\gamma) & \sin(\gamma) & 0 \\ -\sin(\gamma) & \cos(\gamma) & 0 \\ 0 & 0 & 1 \end{bmatrix} \quad (31)$$

Example of an Inventive Self-Noise-Reducing Magnetic Anomaly Detection System

Figure 2:
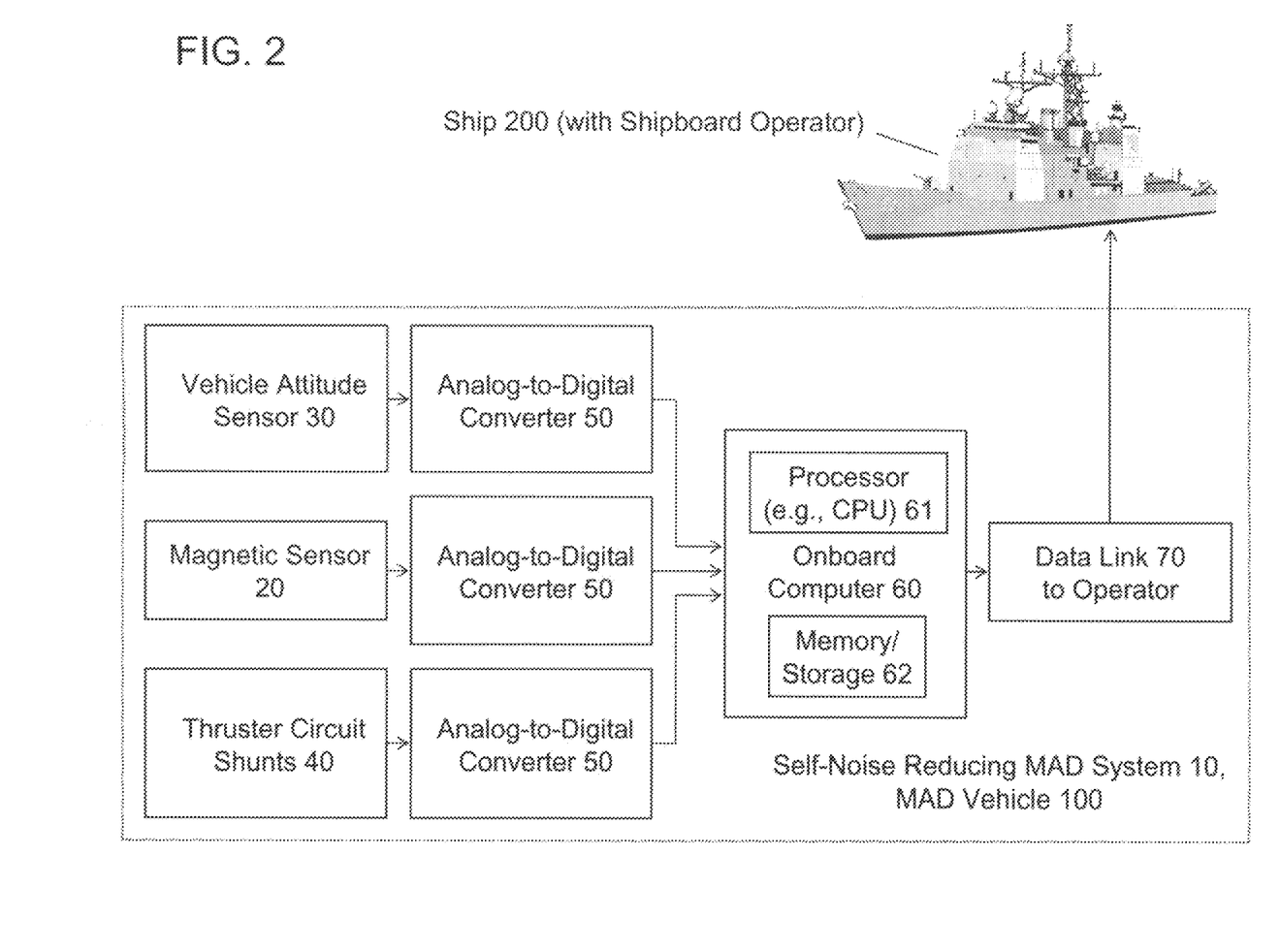
FIG. 2 is a schematic of a typical embodiment of a vehicular magnetic self-noise-reducing magnetic anomaly detection system in accordance with the present invention.

Reference now being made to FIG. 2, a typical embodiment of a system 1000 that performs magnetic anomaly detection (MAD) and self-noise reduction in accordance with the present invention includes several electronic components that are appropriately contained by a sensor conveyance vehicle 100 such as diagrammatically depicted in FIG. 1. As illustrated in FIG. 2, inventive system 10 includes the following electronic components, respectively installed in place onboard vehicle 100: a magnetic sensor 20; a vehicle attitude sensor 30; plural ammeter shunts 40; plural analog-to-digital converters 50; an onboard computer 60; and, a data link device 70. Magnetic sensor 20 pertains to the induced and permanent magnetism associated with vehicle 100. Ammeter shunts 40 pertain to the stray magnetic fields associated with vehicle 100.

Three-axis magnetic sensor (e.g., gradiometer or magnetometer) 20 detects magnetic anomalies. Vehicle attitude sensor (e.g., accelerometer) 30 measures the roll, pitch, and heading of vehicle 100. Several ammeter shunts 40 measure the current flowing through circuits carrying large currents on the vehicle. An "ammeter shunt" (also commonly known as a "current shunt resistor" or "shunt resistor") is a type of resistor that is commonly used for measuring current flowing through a circuit, usually for measuring larger currents. The ammeter shunts 40 are installed in series with cables (not shown) that are routed to the thrusters (not shown) of vehicle 100, and that are routed to other circuits associated with vehicle 100 and carrying currents large enough to create magnetic fields seen by the magnetic sensor 20.

In the inventive system 10, magnetic sensor 20, vehicle attitude sensor 30, and ammeter shunts 40 transmit analog signals to their corresponding analog-to-digital converters 50, which, in turn, transmit digital signals to computer 60. Analog-to-digital converters 50 digitize the data from the magnetic sensor 20, vehicle attitude sensor 30, and ammeter shunts 40. As an example of a connection between a shunt 40 and an analog-to-digital converter 50, the analog-to-digital converter 50 measures the voltage across the shunt 40, which has a known resistance; based on Ohm's Law (voltage equals current times resistance), the analog-to-digital converter 50 is calibrated to output the current that passes through shunt 40. Computer 60 performs several functions in accordance with the present invention, including logging the digitized data, storing mathematical magnetic characterizations, computing variable compensation parameters, and subtracting vehicle 100's noise from the magnetic sensor's measurements while vehicle 100 is searching for anomalies. Data link device 70—which can be a wireless and/or a wire data link device— sends data to an operator in a remote location, such as onboard a surface ship 200, if vehicle 100 is a submersible.

Computer 60 includes a processor 61 and memory/storage 62 for holding and processing data, and for running the present invention's algorithmic program/software (which is embodied in computer code). The inventive computer program product is typically embodied to reduce magnetic self-noise, of the vehicle 10 that houses inventive system 10, through inventive processing of the digitized output analog signals that are received by computer 60 from the electronic sensing/measuring components 20, 30, and 40. Onboard data link 70 can be a device for either wireless communication (e.g., a radio transmitter for radio data transmission) or wired communication (e.g., a modem for wire/cable data transmission via a tether or umbilical).

Figure 3:
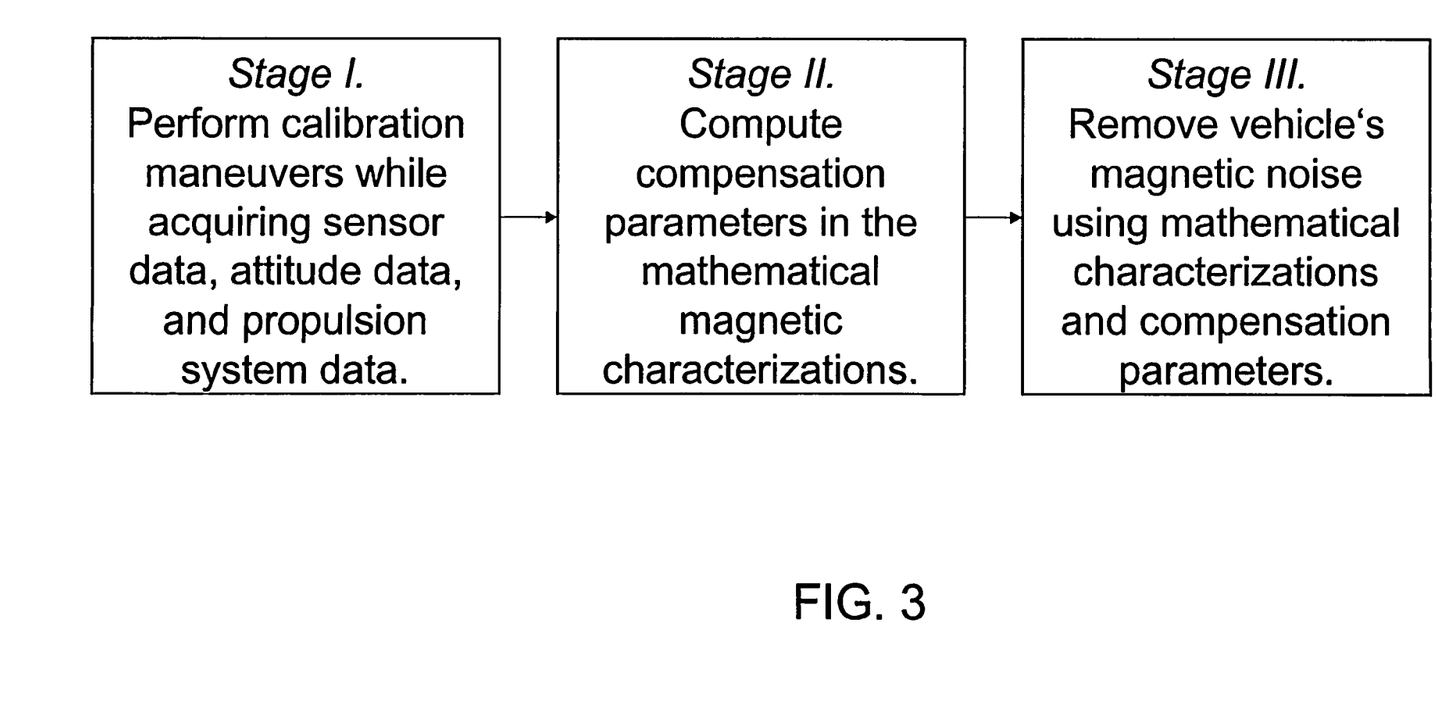
FIG. 3 and FIG. 4 are each a flow diagram of a typical embodiment of a vehicular magnetic self-noise-reducing magnetic anomaly detection process in accordance with the present invention, such as may be implemented using the inventive apparatus shown in FIG. 2. The FIG. 4 flow diagram is a more detailed version of the FIG. 3 flow diagram.
Figure 4:
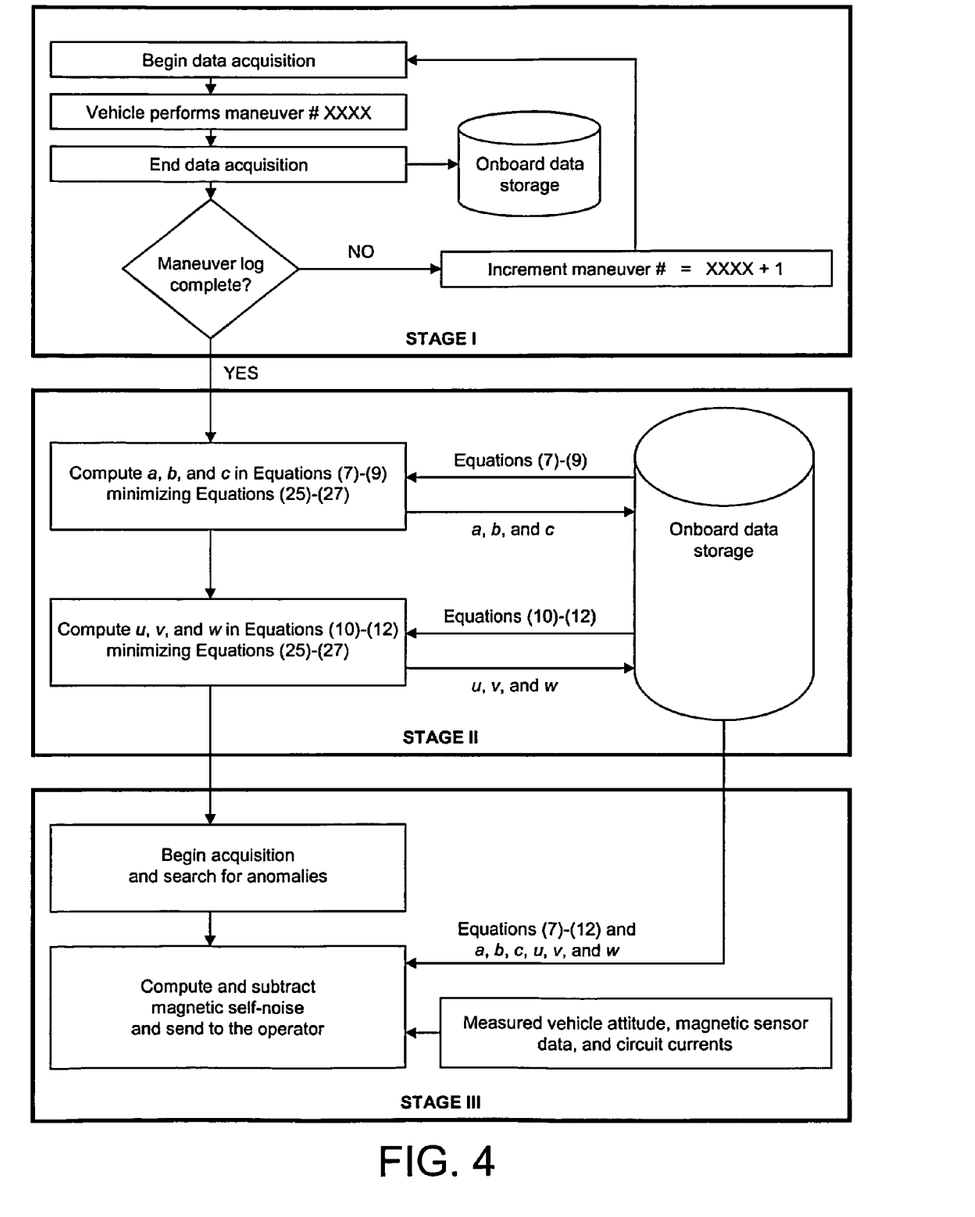

With reference to FIG. 3 and FIG. 4, the present invention's self-noise-reducing magnetic anomaly detection process, as typically embodied, includes three main stages. According to the present invention's first stage, calibration data are collected to solve for the variable compensation parameters. Next, according to the present invention's second stage, the variable compensation parameters are computed from the calibration maneuvers. Finally, according to the present invention's third stage, the characterization and compensation parameters are used to remove the self-noise from data while the vehicle is conducting its mission. The three stages are elaborated upon hereinbelow.

Figure 5:
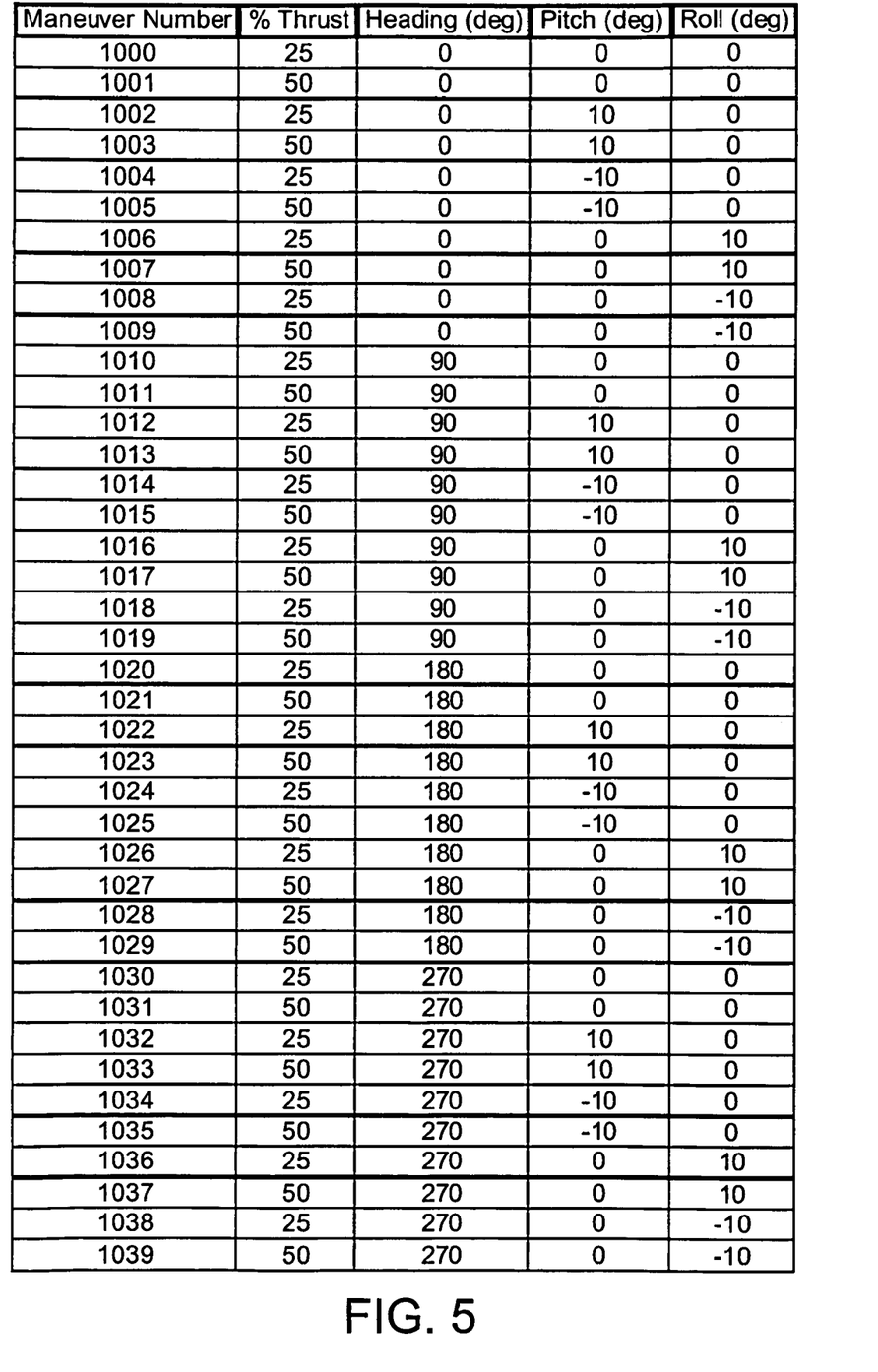
FIG. 5 is an example of a calibration maneuver log table in accordance with the present invention.
Figure 6:
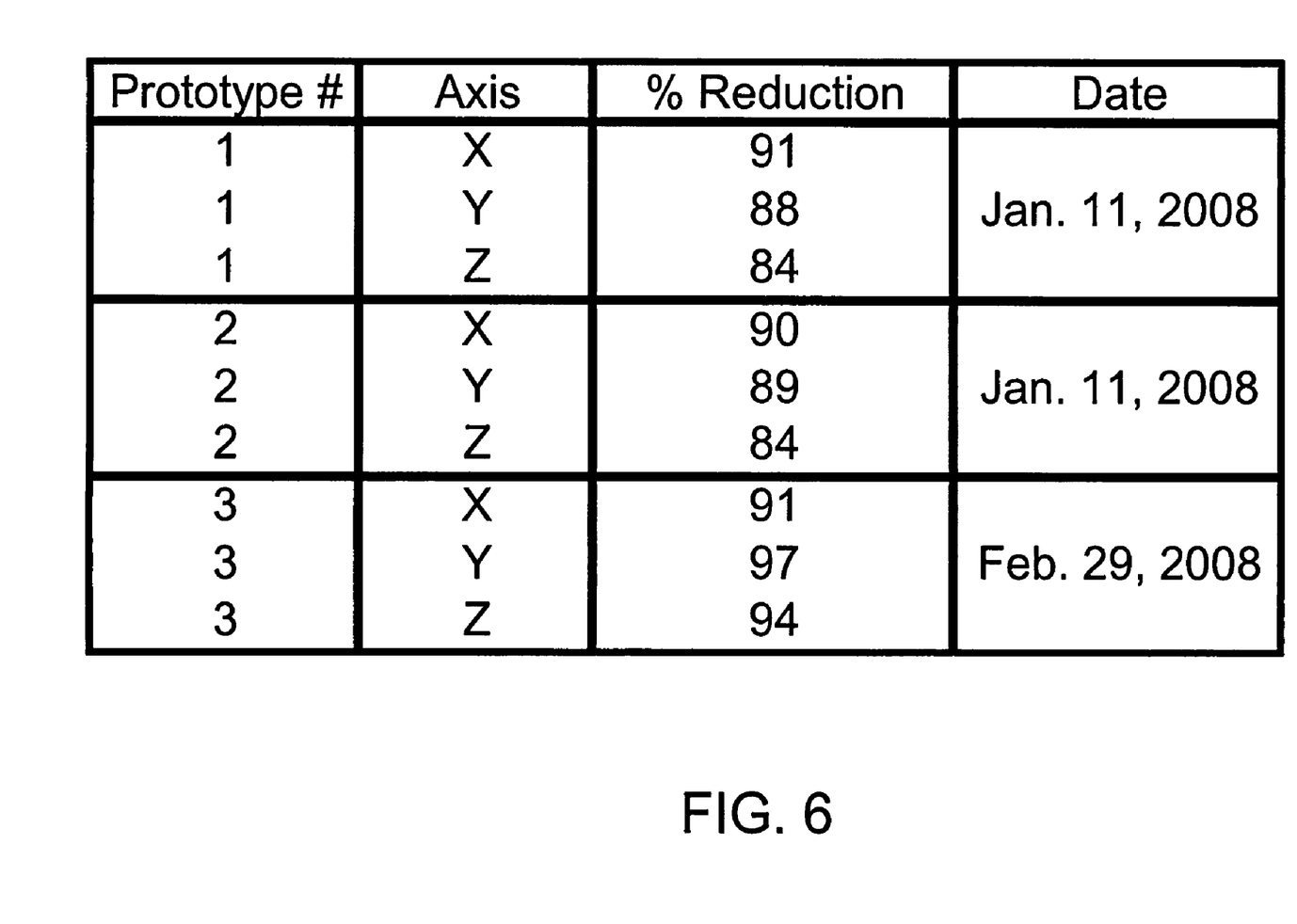
FIG. 6 is table of results of inventive testing conducted by the United States Navy with respect to three remotely operated vehicles.

Stage I: The inventive process is commenced when the vehicle 100 is in the operating area of interest. An operator begins acquiring data from the sensors 20 and 30 and the shunts 40. Referring to FIG. 5, the operator then performs calibration maneuver 1000 while acquiring calibration data. Acquisition of data is completed for that calibration maneuver, and the calibration data is stored on the onboard computer 600. This procedure is repeated for each calibration maneuver until the operator has completed all of the calibration maneuvers set forth in FIG. 5, thereby providing computer 600 with a complete set of calibration data.

Stage II: The operator runs on computer 60 a script that computes and stores a, b, and c in Equations (7) through (9), using the calibration data. Further, the operator runs on computer 60 a script that computes and stores u, v, and w in Equations (10) through (12) using the calibration data. Together, these scripts compute the variable compensation parameters a, b, c, u, v, and w while minimizing Equations (25) through (27).

Stage III: Once the compensation parameters are stored to computer 60, the operator begins acquiring MAD data from the sensors 20 and 30 and the shunts 40. The operator maneuvers vehicle 100 to search for magnetic anomalies. While the operator is maneuvering vehicle 100, a script on computer 60 uses the magnetic sensor 20 data, the attitude sensor 30 data, the shunts 40 data, the compensation parameters s a, b, c, u, v, and w, and Equations (7) through (12), to calculate the magnetic self-noise of vehicle 100. The script then subtracts the magnetic self-noise from the "raw" magnetic sensor 20 data (i.e., the original MAD data from magnetic sensor 20), and transmits this adjusted (self-noise-reduced) magnetic sensor data to the operator located at a remote station, e.g., the MAD control center of a ship 200.

By way of example of the calibration maneuvers, the calibration parameters in the mathematical characterizations for each magnetic source can be computed by performing a series of calibration maneuvers in which (i) vehicle 100's attitude in earth's magnetic field, and (ii) vehicle 100's electrical loads, are varied. During calibration maneuvers, (i) the current that flows through vehicle 100's circuits, (ii) vehicle 100's onboard magnetic data, and (iii) vehicle 100's orientation, are all recorded. First, the self-noise due to stray fields is calculated from two series of measurements (e.g., pairs of odd and even maneuvers as shown in FIG. 5) in which the current powering each of vehicle 100's major onboard circuits is varied, but vehicle 100's orientations are held the same. Next, a series of calibration measurements is taken (e.g., even maneuvers as shown in FIG. 5) in which the pitch, roll, and heading are varied in turn, but the power supplied to vehicle 100's major circuits is held constant.

According to typical inventive practice, all of the circuits—or, at least, all of the major circuits—are taken into consideration in the reduction of self-noise due to magnetic stray fields. In general, performance of the inventive process in this regard can be expected to improve with greater inclusiveness of circuitry; however, in some applications it may be desirable—e.g., in furtherance of efficiency or simplicity—for the calibrator to reduce the number of circuits involved in the stray fields aspect of the calibration. Otherwise expressed, the calibrator may wish to evaluate which circuits are sufficiently "major" to include in the stray fields compensatory aspect of the inventive self-noise reduction process. With this goal in mind, the calibrator can determine the strength of the magnetic anomaly that he or she is trying to detect, and can then measure the self-noise produced by each circuit, one at a time. In this manner, the calibrator can determine which circuits produce a significant self-noise level when compared to the target, thereby weeding out, as negligible, the circuits producing a relatively insignificant self-noise level.

Variation is possible in inventive practice with regard to how the calibration data are collected, for instance in terms of the number of calibration maneuvers that are performed in the operating area. As a general rule of inventive practice, it is necessary to perform ten different maneuvers of different vehicular orientations in order to recover the self-noise from PM and IM. That is, in order to solve for all ten unknowns in the present invention's Equations (10) through (12), it is usually necessary to perform at least ten maneuvers in which the vehicle is in a different orientation each maneuver. Nevertheless, a practitioner of the present invention can increase the number of calibration maneuvers, with a view to increasing the accuracy of the inventive calibration process.

As a general rule of inventive practice concerning the self-noise from stray fields, as long as there are two sets of calibration maneuvers in which the vehicle is in the same orientation while varying the current in the circuits, the unknowns in Equations (7) through (9) can be computed. The number of measurements in each set must be greater than or equal to the number of major current-carrying circuits on the vehicle. Again, the performance of the inventive calibration process tends to improve with greater numbers of maneuvers.

In addition, the inventive calibration process may improve in accordance with orientational variability in the calibrative maneuvering of the vehicle. For instance, regarding self-noise from IM and PM, increases in the degrees of variation in roll, pitch, and heading will tend to result in increases in the accuracy of the process. However, the variability of the vehicular orientation is usually limited by the degrees to which the vehicle can roll and pitch. Nevertheless, inventive practice tends to favor variation of the measurements all three variables (roll, pitch, and heading), in furtherance of accuracy of the inventive calibration process.

Example of Inventive Test Results

Testing of an inventive embodiment of a self-noise-reducing MAD system was conducted on three ROVs in Building 80 (Magnetic Model Lab) at the NSWCCD (Naval Surface Warfare Center, Carderock Division), located in West Bethesda, Md. FIG. 5 shows the results and dates of these tests. The percentages of reduction of vehicular magnetic self-noise ran in the eighties and nineties, thus demonstrating good performance by the inventive embodiment tested.

The present invention, which is disclosed herein, is not to be limited by the embodiments described or illustrated herein, which are given by way of example and not of limitation. Other embodiments of the present invention will be apparent to those skilled in the art from consideration of the instant disclosure, or from practice of the present invention. Various omissions, modifications and changes to the principles disclosed herein may be made by one skilled in the art without departing from the true scope and spirit of the present invention, which is indicated by the following claims.

What is claimed is:

1. A method for algorithmically reducing the magnetic self-noise of a vehicle conducting magnetic anomaly detection, the method comprising:

calculating the calibration coefficients u, v, and w, said calculating of the calibration coefficients u, v, and w including using a computer and using calibration data electrically received by the computer and electrically transmitted by said at least one magnetic sensor and said at least one vehicle attitude sensor; and calculating the magnetic self-noise of the vehicle due to induced magnetization and permanent magnetization, said calculating of the magnetic self-noise including using the computer, using the calculated said u, v, and w, and using magnetic anomaly detection data electrically received by the computer and electrically transmitted by said at least one magnetic sensor and said at least one vehicle attitude sensor;

wherein $$B_X^{IM}+B_X^{PM}=u_1R_{11}+u_2R_{12}+u_3R_{13}+u_4R_{21}+u_5R_{22}+u_6R_{23}+u_7R_{31}+u_8R_{32}+u_9R_{33}+p_{xyz};$$

$$B_Y^{IM}+B_Y^{PM}=v_1R_{11}+v_2R_{12}+v_3R_{13}+v_4R_{21}+v_5R_{22}+v_6R_{23}+v_7R_{31}+v_8R_{32}+v_9R_{33}+p_{xyz};$$

$$B_Z^{IM}+B_Z^{PM}=w_1R_{11}+w_2R_{12}+w_3R_{13}+w_4R_{21}+w_5R_{22}+w_6R_{23}+w_7R_{31}+w_8R_{32}+w_9R_{33}+p_{xyz};$$

$$R = \begin{bmatrix} \cos(\beta)\cos(\gamma) & \cos(\beta)\sin(\gamma) & -\sin(\beta) \\ \sin(\alpha)\sin(\beta)\cos(\gamma)-\cos(\alpha)\sin(\gamma) & \sin(\alpha)\sin(\beta)\sin(\gamma)+\cos(\alpha)\cos(\gamma) & \sin(\alpha)\cos(\beta) \\ \cos(\alpha)\sin(\beta)\cos(\gamma)+\sin(\alpha)\sin(\gamma) & \cos(\alpha)\sin(\beta)\sin(\gamma)-\sin(\alpha)\cos(\gamma) & \cos(\alpha)\cos(\beta) \end{bmatrix};$$

$$R = \begin{bmatrix} R_{11} & R_{12} & R_{12} \\ R_{21} & R_{22} & R_{23} \\ R_{31} & R_{32} & R_{33} \end{bmatrix};$$

u is a coefficient corresponding to the magnetic self-noise in the x-direction due to induced magnetization of the vehicle;

v is a coefficient corresponding to the magnetic self-noise in the v-direction due to induced magnetization of the vehicle;

w is a coefficient corresponding to the magnetic self-noise in the z-direction due to induced magnetization of the vehicle;

$p_{xyz}$ a coefficient corresponding to the magnetic self-noise due to the permanent magnetization of the vehicle;

matrix R represents rotation, of the magnetic field applied to the vehicle, from the earth's coordinate system into the vehicle's coordinate system;

$B_X^{IM}$ is the magnetic self-noise in the x-direction due to induced magnetization of the vehicle;

$B_X^{PM}$ is the magnetic self-noise in the x-direction due to the permanent magnetization of the vehicle;

$B_Y^{IM}$ the magnetic self-noise in the y-direction due to the induced magnetization of the vehicle;

$B_Y^{PM}$ is the magnetic self-noise in the y-direction due to the permanent magnetization of the vehicle;

$B_Z^{IM}$ is the magnetic self-noise in the z-direction due to the induced magnetization of the vehicle;

$B_Z^{PM}$ is the magnetic self-noise in the z-direction due to the permanent magnetization of the vehicle;

$R_{ij}$ is the ith by jth element of the matrix R;

$\alpha$ is the pitch of the vehicle;

$\beta$ is the roll of the vehicle;

$\gamma$ is the heading of the vehicle.

2. The method of claim 1 further comprising subtracting, from said magnetic anomaly detection data electrically received by the computer and electrically transmitted by said at least one magnetic sensor, the calculated said magnetic self-noise due to induced magnetization and permanent magnetization.

3. The method of claim 2 further comprising communicating the results of said subtracting of the calculated said magnetic self-noise.

4. The method of claim 1 further comprising:

calculating the calibration coefficients a, b, and c, said calculating of the calibration coefficients a, b, and c including using the computer and using calibration data electrically received by the computer and electrically transmitted by at least one ammeter shunt; and calculating the magnetic self-noise of the vehicle due to stray magnetic fields, said calculating of the magnetic self-noise due to stray magnetic fields including using the computer, using the calculated said a, b, and c, and using magnetic anomaly detection data electrically received by the computer and electrically transmitted by said at least one ammeter shunt;

wherein a is a coefficient corresponding to the magnetic self-noise in the x-direction due to stray magnetic fields;

b is a coefficient corresponding to the magnetic self-noise in the y-direction due to stray magnetic fields;

c is a coefficient corresponding to the magnetic self-noise in the z-direction due to stray magnetic fields;

$$B_X^{Stray}=a_1I_1+a_2I_2+\ldots+a_NI_N;$$

$$B_Y^{Stray}=b_1I_1+b_2I_2+\ldots+b_NI_N;$$

$$B_Z^{Stray}=c_1I_1+c_2I_2+\ldots+c_NI_N;$$

$B_X^{Stray}$ is the magnetic self-noise in the x-direction due to stray magnetic fields of the vehicle;

$B_Y^{Stray}$ is the magnetic self-noise in the y-direction due to stray magnetic fields of the vehicle;

$B_Z^{Stray}$ is the magnetic self-noise in the z-direction due to stray magnetic fields of the vehicle;

$I_1$ through $I_N$ are the electrical current powering each of N circuits.

5. The method of claim 4 wherein, in accordance with the computer program logic, the computer performs functions including subtracting, from said magnetic anomaly detection data electrically received by the computer and electrically transmitted by said at least one magnetic sensor, the calculated said vehicular magnetic self-noise due to induced magnetization, permanent magnetization, and stray magnetic fields.

6. The method of claim 5 further comprising communicating the results of said subtracting of the calculated said magnetic self-noise.

7. A non-transitory computer-readable storage medium comprising computer-executable computer code characterized by computer program logic for enabling a computer to process data obtained using a vehicle housing the computer, at least one magnetic sensor, and at least one vehicle attitude sensor, the computer code being executable by the computer so that, in accordance with the computer program logic, the computer performs functions including:

calculating the calibration coefficients u, v, and w, said calculating of the calibration coefficients u, v, and w including using calibration data electrically received by the computer and electrically transmitted by said at least one magnetic sensor and said at least one vehicle attitude sensor; and calculating the magnetic self-noise of the vehicle due to induced magnetization and permanent magnetization, said calculating of the magnetic self-noise including using the calculated said u, v, and w, and using magnetic anomaly detection data electrically received by the computer and electrically transmitted by said at least one magnetic sensor and said at least one vehicle attitude sensor;

wherein u is a coefficient corresponding to the magnetic self-noise in the x-direction due to induced magnetization of the vehicle;

v is a coefficient corresponding to the magnetic self-noise in the y-direction due to induced magnetization of the vehicle;

w is a coefficient corresponding to the magnetic self-noise in the z-direction due to induced magnetization of the vehicle;

$p_{xyz}$ is a coefficient corresponding to the magnetic self-noise due to the permanent magnetization of the vehicle;

matrix R represents rotation, of the magnetic field applied to the vehicle, from the earth's coordinate system into the vehicle's coordinate system;

$$B_X^{IM}+B_X^{PM}=u_1 R_{11}+u_2 R_{12}+u_3 R_{13}+u_4 R_{21}+u_5 R_{22}+u_6 R_{23}+u_7 R_{31}+u_8 R_{32}+u_9 R_{33}+p_{xyz};$$

$$B_Y^{IM}+B_Y^{PM}=v_1 R_{11}+v_2 R_{12}+v_3 R_{13}+v_4 R_{21}+v_5 R_{22}+v_6 R_{23}+v_7 R_{31}+v_8 R_{32}+v_9 R_{33}+p_{xyz};$$

$$B_Z^{IM}+B_Z^{PM}=w_1 R_{11}+w_2 R_{12}+w_3 R_{13}+w_4 R_{21}+w_5 R_{22}+w_6 R_{23}+w_7 R_{31}+w_8 R_{32}+w_9 R_{33}+p_{xyz};$$

$$R = \begin{bmatrix} \cos(\beta)\cos(\gamma) & \cos(\beta)\sin(\gamma) & -\sin(\beta) \\ \sin(\alpha)\sin(\beta)\cos(\gamma) - \cos(\alpha)\sin(\gamma) & \sin(\alpha)\sin(\beta)\sin(\gamma) + \cos(\alpha)\cos(\gamma) & \sin(\alpha)\cos(\beta) \\ \cos(\alpha)\sin(\beta)\cos(\gamma) + \sin(\alpha)\sin(\gamma) & \cos(\alpha)\sin(\beta)\sin(\gamma) - \sin(\alpha)\cos(\gamma) & \cos(\alpha)\cos(\beta) \end{bmatrix};$$

$$R = \begin{bmatrix} R_{11} & R_{12} & R_{12} \\ R_{21} & R_{22} & R_{23} \\ R_{31} & R_{32} & R_{33} \end{bmatrix};$$

$B_X^{IM}$ is the magnetic self-noise in the x-direction due to induced magnetization of the vehicle;

$B_X^{PM}$ is the magnetic self-noise in the x-direction due to the permanent magnetization of the vehicle;

$B_Y^{IM}$ is the magnetic self-noise in the y-direction due to the induced magnetization of the vehicle;

$B_Y^{PM}$ is the magnetic self-noise in the y-direction due to the permanent magnetization of the vehicle;

$B_Z^{IM}$ is the magnetic self-noise in the z-direction due to the induced magnetization of the vehicle;

$B_Z^{PM}$ is the magnetic self-noise in the z-direction due to the permanent magnetization of the vehicle;

$R_{ij}$ is the ith by jth element of the matrix R;

$\alpha$ is the pitch of the vehicle;

$\beta$ is the roll of the vehicle;

$\gamma$ is the heading of the vehicle.

8. The computer of claim 7 wherein, in accordance with the computer program logic, the computer performs functions including subtracting, from said magnetic anomaly detection data electrically received by the computer and electrically transmitted by said at least one magnetic sensor, the calculated said magnetic self-noise due to induced magnetization and permanent magnetization.

9. The computer of claim 8 wherein, in accordance with the computer program logic, the computer performs functions including communicating the results of said subtracting of the calculated said magnetic self-noise.

10. The computer of claim 7 wherein, in accordance with the computer program logic, the vehicle houses at least one ammeter shunt, and wherein the computer performs functions including:

calculating the calibration coefficients a, b, and c, said calculating of the calibration coefficients a, b, and c including using calibration data electrically received by the computer and electrically transmitted by said at least one ammeter shunt; and calculating the magnetic self-noise of the vehicle due to stray magnetic fields, said calculating of the magnetic self-noise due to stray magnetic fields including using the calculated said a, b, and c, and using magnetic anomaly detection data electrically received by the computer and electrically transmitted by said at least one ammeter shunt;

wherein a is a coefficient corresponding to the magnetic self-noise in the x-direction due to stray magnetic fields;

b is a coefficient corresponding to the magnetic self-noise in the y-direction due to stray magnetic fields;

c is a coefficient corresponding to the magnetic self-noise in the z-direction due to stray magnetic fields;

$$B_X^{Stray}=a_1 I_1+a_2 I_2+\ldots+a_N I_N;$$

$$B_Y^{Stray}=b_1 I_1+b_2 I_2+\ldots+b_N I_N;$$

$$B_Z^{Stray}=c_1 I_1+c_2 I_2+\ldots+c_N I_N;$$

$B_X^{Stray}$ is the magnetic self-noise in the x-direction due to stray magnetic fields of the vehicle;

$B_Y^{Stray}$ is the magnetic self-noise in the y-direction due to stray magnetic fields of the vehicle;

$B_Z^{Stray}$ is the magnetic self-noise in the z-direction due to stray magnetic fields of the vehicle;

$I_1$ through $I_N$ are the electrical current powering each of N circuits.

11. The computer of claim 10 wherein, in accordance with the computer program logic, the computer performs functions including subtracting, from said magnetic anomaly detection data electrically received by the computer and electrically transmitted by said at least one magnetic sensor, the calculated said magnetic self-noise due to induced magnetization, permanent magnetization, and stray magnetic fields.

12. The computer of claim 11 wherein, in accordance with the computer program logic, the computer performs functions including communicating the results of said subtracting of the calculated said magnetic self-noise.

13. A system for performing magnetic anomaly detection so as to reduce the magnetic self-noise of the vehicle housing the system, the system comprising at least one magnetic sensor, at least one vehicle attitude sensor, at least one ammeter shunt, and a computer, said computer executing computer code characterized by computer program logic for enabling said computer to process output from said at least one magnetic sensor, said at least one vehicle attitude sensor, and said at least one ammeter shunt, said computer code being executable by said computer so that, in accordance with said computer program logic, said computer performs steps including:

characterizing the vehicular magnetic self-noise due to induced magnetization and permanent magnetization according to the equations $$B_X^{IM}+B_X^{PM}=u_1R_{11}+u_2R_{12}+u_3R_{13}+u_4R_{21}+u_5R_{22}+u_6R_{23}+u_7R_{31}+u_8R_{32}+u_9R_{33}+p_{xyz};$$

$$B_Y^{IM}+B_Y^{PM}=v_1R_{11}+v_2R_{12}+v_3R_{13}+v_4R_{21}+v_5R_{22}+v_6R_{23}+v_7R_{31}+v_8R_{32}+v_9R_{33}+p_{xyz};$$

$$B_Z^{IM}+B_Z^{PM}=w_1R_{11}+w_2R_{12}+w_3R_{13}+w_4R_{21}+w_5R_{22}+w_6R_{23}+w_7R_{31}+w_8R_{32}+w_9R_{33}+p_{xyz};$$

$$R = \begin{bmatrix} \cos(\beta)\cos(\gamma) & \cos(\beta)\sin(\gamma) & -\sin(\beta) \\ \sin(\alpha)\sin(\beta)\cos(\gamma) - \cos(\alpha)\sin(\gamma) & \sin(\alpha)\sin(\beta)\sin(\gamma) + \cos(\alpha)\cos(\gamma) & \sin(\alpha)\cos(\beta) \\ \cos(\alpha)\sin(\beta)\cos(\gamma) + \sin(\alpha)\sin(\gamma) & \cos(\alpha)\sin(\beta)\sin(\gamma) - \sin(\alpha)\cos(\gamma) & \cos(\alpha)\cos(\beta) \end{bmatrix};$$

$$R = \begin{bmatrix} R_{11} & R_{12} & R_{12} \\ R_{21} & R_{22} & R_{23} \\ R_{31} & R_{32} & R_{33} \end{bmatrix};$$

characterizing the vehicular magnetic self-noise due to stray magnetic fields according to the equations $$B_X^{Stray}=a_1I_1+a_2I_2+\ldots+a_NI_N;$$

$$B_Y^{Stray}=b_1I_1+b_2I_2+\ldots+b_NI_N;$$

$$B_Z^{Stray}=c_1I_1+c_2I_2+\ldots+c_NI_N;$$

calculating a, b, c, u, v, and w, said calculating of a, b, c, u, v, and w including using said equations and using calibration data from said at least one magnetic sensor, said at least one vehicle attitude sensor, and said at least one ammeter shunt, wherein a is a coefficient corresponding to the vehicular magnetic self-noise in the x-direction due to stray magnetic fields; b is a coefficient corresponding to the vehicular magnetic self-noise in the y-direction due to stray magnetic fields; c is a coefficient corresponding to the vehicular magnetic self-noise in the z-direction due to stray magnetic fields; u is a coefficient corresponding to the vehicular magnetic self-noise in the x-direction due to induced magnetization of the vehicle; v is a coefficient corresponding to the vehicular magnetic self-noise in the y-direction due to induced magnetization of the vehicle; w is a coefficient corresponding to the vehicular magnetic self-noise in the z-direction due to induced magnetization of the vehicle; and calculating the vehicular magnetic self-noise due to induced magnetization, permanent magnetization, and stray magnetic fields, said calculating of the vehicular magnetic self-noise including using said equations, using the calculated said a, b, c, u, v, and w, and using magnetic anomaly detection data from said at least one magnetic sensor, said at least one vehicle attitude sensor, and said at least one ammeter shunt;

wherein $B_X^{IM}$ is the magnetic self-noise in the x-direction due to induced magnetization of the vehicle, $B_X^{PM}$ is the magnetic self-noise in the x-direction due to the permanent magnetization of the vehicle, $B_X^{Stray}$ is the magnetic self-noise in the x-direction due to stray magnetic fields of the vehicle, $B_Y^{IM}$ is the magnetic self-noise in the y-direction due to the induced magnetization of the vehicle, $B_Y^{PM}$ is the magnetic self-noise in the y-direction due to the permanent magnetization of the vehicle, $B_Y^{Stray}$ is the magnetic self-noise in the y-direction due to stray magnetic fields of the vehicle, $B_Z^{IM}$ is the magnetic self-noise in the z-direction due to the induced magnetization of the vehicle, $B_Z^{PM}$ is the magnetic self-noise in the z-direction due to the permanent magnetization of the vehicle, $B_Z^{Stray}$ is the magnetic self-noise in the z-direction due to stray magnetic fields of the vehicle, a, b, c, u, v, and w are unknown calibration coefficients, $R_{ij}$ is the ith by jth element of the matrix R, $\alpha$ is the pitch of the vehicle housing the system, $\beta$ is the roll of the vehicle housing the system, $\gamma$ is the heading of the vehicle housing the system, and $I_1$ through $I_N$ are the current powering each of N circuits, $p_{xyz}$ is a coefficient corresponding to the magnetic self-noise due to the permanent magnetization of the vehicle, matrix R represents rotation, of the magnetic field applied to the vehicle, from the earth's coordinate system into the vehicle's coordinate system.

14. The system for performing magnetic anomaly detection as recited in claim 13, wherein said magnetic anomaly detection data from said at least one magnetic sensor is the raw said magnetic anomaly detection data from said at least one magnetic sensor, and wherein said computer performs the step of adjusting the raw said magnetic anomaly detection data from said at least one magnetic sensor, said adjusting including subtracting, from the raw said magnetic anomaly detection data from said at least one magnetic sensor, the calculated said vehicular magnetic self-noise due to induced magnetization, permanent magnetization, and stray magnetic fields.

15. The system for performing magnetic anomaly detection as recited in claim 14, wherein the system further comprises a data link device for transmitting, to a remote location, the adjusted said magnetic anomaly detection data from said at least one magnetic sensor.

* * * * *